United States Patent [19]

Gibson et al.

[11] Patent Number: 4,555,301

[45] Date of Patent: Nov. 26, 1985

[54] FORMATION OF HETEROSTRUCTURES BY PULSED MELTING OF PRECURSOR MATERIAL

[75] Inventors: John M. Gibson, Upper Montclair; Dale C. Jacobson, Independence Township, Warren County; John M. Poate, Summit; Raymond T. Tung, Berkeley Heights, all of N.J.

[73] Assignee: AT&T Bell Laboratories, Murray Hill, N.J.

[21] Appl. No.: 506,069

[22] Filed: Jun. 20, 1983

[51] Int. Cl.$^4$ ................................................ C30B 1/08
[52] U.S. Cl. ........................ 156/617 R; 156/DIG. 70; 156/DIG. 73; 156/DIG. 80; 156/DIG. 102; 427/53.1; 29/576 T
[58] Field of Search ................... 156/617 R, DIG. 64, 156/DIG. 70, DIG. 73, DIG. 80, DIG. 102; 29/576 T; 427/53.1

[56] References Cited

U.S. PATENT DOCUMENTS

| | | | |
|---|---|---|---|
| 3,928,092 | 12/1975 | Ballamy et al. | 148/175 |
| 4,249,962 | 2/1981 | Celler | 427/53.1 |
| 4,275,093 | 6/1981 | Sasaki et al. | 156/DIG. 64 |
| 4,279,688 | 7/1981 | Abrahams et al. | 156/DIG. 64 |
| 4,284,467 | 8/1981 | Loebner et al. | 156/DIG. 70 |
| 4,292,091 | 9/1981 | Togei | 427/53.1 |
| 4,318,752 | 3/1982 | Tien | 427/53.1 |
| 4,359,485 | 11/1982 | Donnelly et al. | 427/53.1 |
| 4,359,486 | 11/1982 | Patalong et al. | 427/53.1 |
| 4,395,433 | 7/1983 | Nagakubo et al. | 427/53.1 |
| 4,477,308 | 10/1984 | Gibson et al. | 156/612 |

FOREIGN PATENT DOCUMENTS

| | | | |
|---|---|---|---|
| 1244732 | 7/1967 | Fed. Rep. of Germany | 156/DIG. 70 |
| 2053536 | 5/1972 | Fed. Rep. of Germany | 156/DIG. 70 |
| 56-23781 | 3/1981 | Japan | 156/DIG. 80 |
| 56-58224 | 5/1981 | Japan | 156/DIG. 80 |
| 57-23218 | 2/1982 | Japan | 156/DIG. 80 |

OTHER PUBLICATIONS

Shirley S. Chu et al., Gallium Arsenide Films on Re-crystallized Germanium Films, Journal of Applied Physics, vol. 48, No. 11, Nov. 1977, pp. 4848–4849.
J. C. Bean et al., Silicon/Metal Silicide Heterostructures Grown by Molecular Beam Epitaxy, Appl. Phys. Lett. 37(7), Oct. 1, 1980, pp. 643–646.
*Applied Physics Letters*, vol. 38(12), Jun. 15, 1981, "Interface and Surface Structure of Epitaxial NiSi$_2$ Films" by K. C. R. Chiu et al., pp. 988–990.
*Applied Physics Letters*, vol. 33(11), Dec. 1, 1978, "Laser-Induced Reactions of Platinum and Other Metal Films with Silicon," by J. M. Poate et al., pp. 918–920.
T. W. Sigmon, "Silicide Formation Using Laser & Electron Beams", pp. 511–523, in J. F. Gibbons et al., Editors, "Laser & Electron Beam Solid Interactions & Materials Processing", North Holland Pub. Co. (1981).
J. M. Poate et al., "Laser Annealing of Semiconductors," Academic Press (1982), pp. 69–101.

*Primary Examiner*—David L. Lacey
*Attorney, Agent, or Firm*—Eugen E. Pacher

[57] ABSTRACT

A method for forming heterostructures comprising multiconstituent epitaxial material, on a substrate comprises formation of a layer of "precursor" material on the substrate, and momentarily melting the precursor material by pulsed irradiation. The precursor material has the same major chemical constituents as the multiconstituent material to be formed, albeit not necessarily in the same proportions. In at least some systems (e.g., nickel or cobalt silicides on Si), solid state annealing of the re-solidified material often improves substantially the quality of the epitaxial material formed, resulting in substantially defect-free, substantially monocrystalline, material. An exemplary application of the inventive method is the formation of single crystal epitaxial NiSi$_2$ on Si(100).

17 Claims, 5 Drawing Figures

U.S. Patent  Nov. 26, 1985  4,555,301
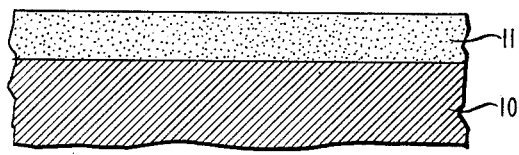
FIG. 1
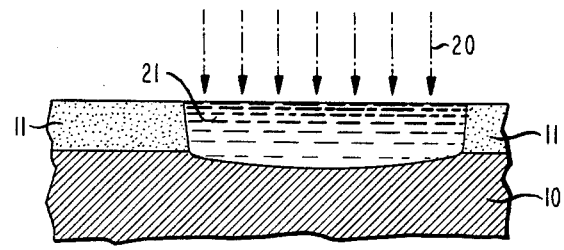
FIG. 2
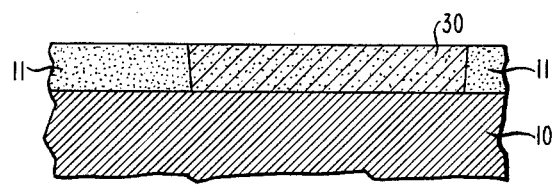
FIG. 3
FIG. 4
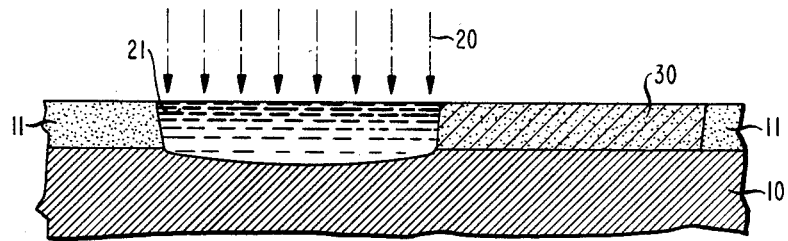
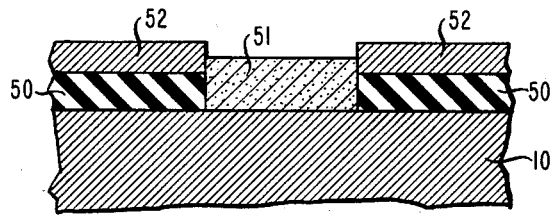
FIG. 5

FORMATION OF HETEROSTRUCTURES BY PULSED MELTING OF PRECURSOR MATERIAL

FIELD OF THE INVENTION

This invention pertains to the growth of multiconstituent material, including heteroepitaxial material, on a substrate by means of pulsed melting of a precursor material.

BACKGROUND OF THE INVENTION

The ability to form a layer of multiconstituent material on a substrate of different composition, especially the ability to form a multiconstituent epitaxial layer (referred to as a heteroepitaxial layer), is of current or potential importance in many fields of technology, e.g., in semiconductor device manufacture or integrated optics.

In particular, heteroepitaxy has been a field of active research for some time. These efforts have led to some technologically important applications. For instance, the III-V or II-VI semiconductors have been combined with ternary materials in heteroepitaxial systems. Exemplary of this application is $GaAs/Al_xGa_{1-x}As$ that is widely used in opto-electronic devices. Patterned monocrystalline layers of III-V compounds have also been grown on III-V substrates (U.S. Pat. No. 3,928,092, issued Dec. 23, 1975 to W. C. Ballamy et al). Semiconductor layers are also being grown epitaxially on insulators. An example of such a heteroepitaxial system of technological importance is silicon on sapphire. Similarly, compound semiconductors, especially the III-V compounds, have been grown on sapphire substrates. For a general review, see for instance, *Heteroepitaxial Semiconductors for Electronic Devices*, G. W. Cullen and C. C. Wang, editors, Springer-Verlag, New York (1978).

Despite the efforts of the last years, the number of heteroepitaxial systems that have been developed sufficiently to permit electronic device application is small. In particular, the number of demonstrated structures comprising an epitaxial metal layer and/or an epitaxial insulator on a semiconductor substrate is at present very limited. However, such systems not only are required for three-dimensional integrated circuits, but would permit the realization of novel device structures, e.g., a metal base transistor. Chief among the reported heterostructures containing an epitaxial metal layer are $CoSi_2$ on Si, and $NiSi_2$ on Si.

Prior art methods for forming metal silicides on Si(111) typically involve depositing the silicide-forming metal onto the silicon substrate, followed by heating the substrate, thereby forming a sequence of increasingly Si-rich silicides, (e.g., $Ni_2Si \rightarrow NiSi \rightarrow NiSi_2$). The resulting epitaxial silicide layers, however, typically are not single crystal. Instead, the epitaxial material formed typically consists of two types of crystallites, both sharing the surface normal [111] direction with the substrate, but one having an orientation that is rotated by 180 degrees about the normal, as compared to the substrate ("type B"), and the other having an orientation that is identical to that of the substrate ("type A"). These crystallites of course are separated by high-angle grain boundaries which reduce the usefulness of this material as conductor material in VLSI semiconductor devices. Furthermore, the presence of both A and B type crystallites typically makes such material unsuitable as substrate layer for the growth of device-quality heteroepitaxial material thereon, e.g., growth of a further Si layer, as would be required in the manufacture of three-dimensional integrated circuits.

These prior art methods have also been unsuccessful in growing single crystal $NiSi_2$ on Si(100), due to (111) faceting of the $NiSi_2$/Si interface. See for instance K. C. Chiu et al, *Applied Physics Letters*, Vol. 38, pp. 988–990 (1981). Growth of metal silicide with a uniform interface on Si(100) is, however, of great technological importance since current silicon technology uses almost exclusively (100)-oriented material. For the same reason, the growth of epitaxial single crystal metal silicides on Si(100) is important.

A method for forming single crystal metal silicide-silicon heterostructures was disclosed, together with devices based on such a structure, in commonly assigned U.S. Pat. No. 4,492,971, issued Jan. 8, 1985, to J. C. Bean et al, entitled, "Metal Silicide-Silicon Heterostructures". See also commonly assigned U.S. Patent Application Ser. No. 445,014, filed Nov. 29, 1982, a division of U.S. Pat. No. 4,492,971. The above application teaches that essentially monocrystalline silicide can be grown epitaxially on a single crystal silicon substrate by exposing the substrate to a vapor comprising a silicide-forming metal, e.g., to Ni vapor, while heating the substrate to a temperature in the range of 550 to 850 degrees C. Under these conditions, the metal reacts in situ as it deposits and forms a layer of epitaxial single crystal silicide, e.g., $NiSi_2$.

A method for forming a single crystal heteroepitaxial layer of multiconstituent material on a substrate that can, inter alia, be advantageously applied to the growth of epitaxial metal silicide layers on silicon, including $NiSi_2$ on Si(100), was disclosed by J. M. Gibson et al, in commonly assigned U.S. Pat. No. 4,477,308, issued Oct. 16, 1984, entitled, "Heteroepitaxy of Multiconstituent Material by Means of a Template Layer". The application teaches that single crystal multiconstituent epitaxial layers, e.g., $NiSi_2$, can be grown on an appropriate single crystal substrate by depositing a thin disordered layer of "template-forming" material, e.g., Ni, on the substrate surface at a relatively low deposition temmperature, raising the substrate temperature to an intermediate transformation temperature, thereby causing the template-forming material to undergo a solid state reaction that results in formation of "template" material, e.g., substantially $NiSi_2$. Onto the thus formed thin template layer is then deposited the material for the multiconstituent layer, e.g., Ni, or Ni and Si, with the substrate maintained at a (typically higher) temperature at which the equilibrium silicide, e.g., $NiSi_2$, is formed by a solid state process.

Surface alloying by irradiation-induced melting has also been used to form metal silicides on silicon. For instance, J. M. Poate et al, *Applied Physics Letters*, Vol. 33, pp. 918–920, (1978) report alloying Pt, Pd, and Ni films to Si using Q-switched Nd-YAG radiation. Irradiating the metal film, deposited onto a Si Substrate, with such radiation, of intensity sufficient to produce melting of the metal, resulted in macroscopically very uniform alloy layers whose average composition could be changed over a wide range by varying film thickness and/or laser power. The reacted layer, however, consisted not of single phase material but had a cellular microstructure, with typical cell diameters of 1000 Å.

T. W. Sigmon reports (pp. 511–523 1 of *Laser and Electron-Beam Solid Interactions and Materials Process-* ing, J. F. Gibbons et al, editors, MRS Symposia Proceedings, Vol. 1, (1981), North Holland, N.Y.) that single phase silicides can be formed by heating a metal layer on Si in the solid state with CW lasers. Again, the resulting silicide is not single crystal material, and thus typically not acceptable for many possible device applications.

Because of the technological importance of structures comprising a multiconstituent material layer on a substrate, especially of an epitaxial metallic, semiconducting, or insulating layer on silicon or other semiconductor substrate, and of uniform interfaces in Si(100) heterostructures, methods for producing such structures are of considerable interest. Of special interest would be a method for producing such structures that can be practiced without the use of ultra-high vacuum conditions. This application discloses such a method.

DEFINITIONS

A "multiconstituent" material herein is a material consisting substantially of material of nominal chemical composition $A_xB_yC_z...$, where A, B, ... are arbitrary chemical elements, and at least x and y are different from zero.

"Epitaxial" material is crystalline material, grown on a single crystal substrate, with the epitaxial material having at least one crystallographic axis in common with the substrate.

A "heterocompositional" material is material on a substrate, with the concentration of at least one chemical element being substantially different in the substrate material from that in the overlayer material. Epitaxial heterocompositional material is referred to as "heteroepitaxial" material. A structure comprising hetercompositional material is a heterostructure.

"Precursor" material is material, typically amorphous or polycrystalline, formed on a substrate upon which a heterocompositional layer (the "first material") is to be formed by the inventive method, the precursor material consisting of the same major chemical constituents as the desired first material, although not necessarily in the same proportions as in the desired first material. Furthermore, precursor material need not necessarily be microscopically chemically or physically homogeneous.

The "major" chemical constituents of a material are those constituents whose quantitative presence is generally indicated in the chemical formula of the material; e.g., Zn-doped GaAs has the two major constituents Ga and As. Thus, impurities and/or dopants are not considered to be major constituents.

"Microscopic" uniformity of a material layer refers to uniformity of the material on a scale typically substantially less than the layer thickness, and "macroscopic" uniformity to uniformity of the material on a scale typically larger than the layer thickness.

SUMMARY OF THE INVENTION

Disclosed is a method for producing a heterostructure, the heterostructure preferably comprising heteroepitaxial multiconstituent material, including monocrystalline heteroepitaxial material. The method comprises forming a layer of "precursor" material on the substrate, and momentarily melting at least some of the precursor material by means of irradiation with a pulsed heat source, e.g., a pulsed layer, electron, or ion beam, the irradiation conditions selected to result in melting to at least the precursor/substrate interface.

The composition of the precursor material can vary between rather wide bounds, provided that the major chemical constituents of the precursor material are the same as those of the heterocompositional material (the "first" material) to be formed. However, in many systems it is preferred to practice the invention with precursor material whose composition does not deviate substantially from that of the first material, with typically no major constituent concentration differing in the precursor material by more than 50 percent, preferably no more than 25 percent, from the constituent's concentration in the first material.

On the other hand, in at least some systems (e.g., nickel silicide/silicon), the composition of the precursor material can advantageously differ substantially from that of the first material. In such systems, mass transport during a post-melt solid state annealing step typically results in formation of stoichiometric material of high crystalline perfection.

A preferred application of the invention is the formation of heteroepitaxial material, e.g., metallic, semiconducting, or dielectric material, on Si, Ge, or III-V or II-VI compound semiconductor substrates. Among these, the formation of metal silicide material (e.g., Ni, Co, Pd, Pt, Cr, W, Ti, Zr, Hf, V, Nb, Ta, Fe, Mg, Rh, or Mo silicide) on Si substrates is considered an especially advantageous application of the invention.

A further preferred application of the invention is the formation of heterocompositional material with uniform overlayer/substrate interface, especially in systems subject to faceting or to formation of otherwise nonuniform interfaces in some prior art formation processes, e.g., $CoSi_2$ on Si(100).

The inventive method for forming heterocompositional multiconstituent material is considered to be of broad applicablity. In particular, it is considered to apply to the growth of multiconstituent epitaxial material, either in unpatterned or patterned layer form, on multiconstituent as well as on monoconstituent substrates.

The inventive method does not require ultra high vacuum (UHV) processing, or perhaps even vacuum processing, and does not require stringent substrate surface preparation. It is thus, for instance, well suited for integration into current semiconductor device processing lines.

BRIEF DESCRIPTION OF THE DRAWING

FIG. 1 schematically shows in cross section a layer of precursor material on a substrate;

FIG. 2 in the same way depicts a pulse-melted region of precursor material;

FIG. 3 schematically shows re-solidified material;

FIG. 4 similarly illustrates stepped pulse-melting and re-solidifying of precursor material; and FIG. 5 schematically illustrates formation of a patterned layer according to the invention.

In the Figures, like parts are identified by like numerals.

DETAILED DESCRIPTION

Important aspects of this invention are formation, by any appropriate method, of precursor material, momentary melting of some precursor material, followed by re-solidification of the molten material. This is illustrated schematically in FIGS. 1–3. FIG. 1 shows a layer 11 of precursor material on substrate 10; FIG. 2 shows a beam 20 of pulsed radiation incident on a region of precursor material, producing melted material in region 21; and FIG. 3 shows re-solidified material 30.

As defined above, precursor material contains the same major chemical constituents as the first material, and does not contain substantial amounts of any element not to be present in the desired first material. In some systems, e.g., those comprising a substrate having the calcium fluoride crystal structure, considerable latitude with regard to precursor composition exists. However, we believe that in other systems advantageous results will typically be produced if the precursor material is of at least approximately the same chemical composition as the first material, and is of substantially uniform composition down to the microscopic scale. This can, for instance, be achieved by co-deposition of the constituents, e.g., by co-evaporation, sputter deposition, or molecular beam epitaxy. In such systems, the concentration of no major constituents of the precursor material should deviate by more than about 50 percent from its concentration in the desired first material, and preferably by not more than 25 percent. For instance, for first material of composition $A_xB_y$ the precursor composition should be between $A_{0.5x}B_y$ and $A_xB_{0.5y}$, preferably between $A_{0.75x}B_y$ and $A_xB_{0.75y}$.

Precursor material can at least in some systems also be formed by solid state reaction. For instance, deposition of an appropriate metal layer onto a Si substrate (e.g., by evaporation, sputtering, electrodeposition, or electroless deposition), followed by heating of the substrate/metal combination, results typically in formation of metal silicide by mass transport between substrate and overlayer, with the nature of the silicide depending on, inter alia, the reaction temperature. Such "equilibrium" silicide can have the average composition $MSi_x$, with $0<x\leq n$, for a silicide first material of composition $MSi_n$.

Precursor material may have one or more major constituents in common with the substrate material, or it may have no major constituent in common therewith. In the former case the above "reaction" technique for forming the precursor material may be useful, whereas the reaction technique is not applicable in the latter case.

The above general procedures can be exemplified by the formation of nickel silicide precursor material (for producing $NiSi_2$) on a silicon substrate. Material of average composition $NiSi_x$, $0<x\leq 2$, can be codeposited on the substrate, constituting the precursor material. On the other hand, material of the same average composition, or pure Ni, can be deposited on the substrate and the combination reacted at an elevated temperature, thereby producing nickel silicide precursor material.

It will of course be understood that the thickness and composition of the precursor material (and therefore, if applicable, of the material deposited for transformation into precursor material) is to be selected to yield a first material layer of the desired thickness and composition. For instance, a 100 Å thick Ni layer yields an about 365 Å thick layer of $NiSi_2$.

Momentary melting of all or part of a layer of precursor material, to a depth at least sufficient to result in "wetting" of the substrate, is achieved by means of pulsed heating, typically by means of pulsed electromagnetic, electron, or ion radiation, preferably laser or electron radiation. The pulse length and energy depends typically on such parameters as precursor layer thickness, precursor material melting temperature and latent heat of melting, and thermal conductivity of the substrate material. The pulse is advantageously selected to be short, typically not exceeding 1 μsec, preferably not exceeding 100 nsec.

The size of the irradiated region depends typically on the details of the process and can vary from a few micrometers in diameter to substantially wafer size. Areas larger than the beam size can be processed by a stepping process, as illustrated in FIG. 4, wherein resolidified region 30 had been pulse-melted prior to irradiation of region 21. For large-area irradiation care is required to assure flux uniformity. This can be accomplished by conventional methods well known to those skilled in the art. The wavelength of electromagnetic radiation used is advantageously selected to be strongly absorbed by the precursor material. By way of an example, we have melted nickel silicide and cobalt silicide precursor material with radiation from a ruby laser (0.694 μm).

The pulse length and radiation intensity (or pulse length, beam current and energy, as the case may be) are advantageously selected to result in melting of the precursor material to at least the substrate/precursor interface, to produce "wetting" of the single crystal substrate material. Procedures for approximately determining conditions for achieving such melting are well known in the art. See, for instance, *Laser Annealing of Semiconductors*, J. M. Poate et al, editors, Academic Press, (1982), especially pp. 69–101. For instance, we have used pulses of 30 nsec length and about 1 J/cm² energy in the above-referred-to melting of nickel and cobalt silicide.

Pulse-melting is of course followed by resolidification within a very short time, typically within less than about 1 μsec after cessation of the irradiation. It will be appreciated that, intentionally or unintentionally, some substrate material typically will be melted during the melting step, and thus be incorporated into the re-solidified material. Since in the liquid state pulse-melted material typically undergoes some compositional mixing, the re-solidified material will typically comprise a finite thickness region that is enriched in substrate material. For instance, growth by the inventive method of $CoSi_2$ on Ge will typically result in the formation of a transition zone in which the Ge concentration diminishes from essentially 100 percent to (at least approximately) zero.

The quality of the re-solidified material can sometimes be improved, at least in some cases dramatically so, by a (solid state) post-anneal of the heterostructure. The anneal is advantageously carried out at a temperature at which the first material is the equilibrium phase (for metal silicides, for instance, typically at least about 500° C.), and for a time sufficient to produce substantially complete formation of equilibrium phase material of low defect density, especially substantially free of extended defects in the bulk of the first material. First material of this quality will be referred to as "substantially defect-free". Also, we will refer to epitaxial material consisting of more than about 95 percent material of one orientation as "substantially monocrystalline" material.

For instance, we annealed a Si substrate with an approximately 100 Å thick layer of re-solidified epitaxial nickel silicide material (average composition $NiSi_{1.6}$, essentially 100 percent type B orientation) at 800 degrees C. After the anneal the silicide overlayer was found to be essentially 100 percent stoichiometric epitaxial, substantially defect-free, single crystal $NiSi_2$ of type B orientation, a result which, we believe, could not be achieved in this system without the annealing step. Rutherford backscattering spectroscopy (RBS) of this material yielded a $\chi_{min}$ of 3.1 percent in the <111> channeling direction, indicating essentially perfect crystallinity.

As was mentioned above, the average composition of the precursor material need not be the same as the composition of the heteroepitaxial material to be formed. In fact, we have made the surprising discovery that at least in some cases, (e.g., systems having the calcium fluoride structure) the crystalline quality of the resulting first material is better if the precursor composition differs substantially from the first material composition. For instance, we have found that the inventive method yields $NiSi_2$ of better quality if the precursor material is of approximately average composition NiSi than if its average composition is $NiSi_2$.

As had already been indicated, the instant method offers a convenient method for producing a heterocompositional overlayer with uniform interface on a substrate. For instance, facet-free $NiSi_2$ and $CoSi_2$ can be produced thereby on Si(100), which is a result of potentially substantial importance in VLSI processing.

A layer grown by means of the inventive method, especially a single crystal epitaxial layer, can of course serve as a substrate for the growth of a further layer thereon. Such double-heterostructures are useful, for instance, for producing three-dimensional semiconductor devices, e.g., metal base transistors.

The inventive method can also be used to form a patterned layer of first material. For instance, a patterned layer of $SiO_2$, the mask, can be formed on a Si wafer by conventional methods. Depositing a layer of Ni uniformly over the wafer, and heating the wafer to about 450° C., produces nickel silicide precursor material in the windows of the mask, with Ni remaining on the mask. The Ni can either be removed at this stage by means of an appropriate etch, or the precursor material can first be pulse-melted, and the Ni removed thereafter. This process is illustrated schematically in FIG. 5, showing a mask 50 on substrate 10, with re-solidified material 51 in a window in the mask, and material 52 (e.g., Ni) atop the masking regions.

In the following examples, silicon substrates were cleaned by a standard chemical procedure comprising degreasing in trichloroethylene, rinsing in acetone and methanol, and dipping in buffered HF. Also, the pulse melting in all the examples was done in air on an x-y table, by means of 30 nsec pulses from a Q-switched ruby laser, homogenized to have a uniform beam of 7 mm diameter. Furthermore, heat treatments were generally carried out in a tubular furnace, under $10^{-6}$-$10^{-7}$ Torr vacuum.

EXAMPLE 1

Approximately 300 Å of Ni were evaporated uniformly at $10^{-6}$ Torr onto a Si(111) wafer, followed by annealing of the wafer at 800 degrees C. for 30 minutes. This resulted in formation of (111) $NiSi_2$ (1090 Å, both A and B type). Laser irradiation (1.1 J/cm$^2$) resulted in momentary melting and resolidification (estimated solidification interface velocity 1.5 m/sec). The re-solidified material was at least 95 percent type B orientation, remainder being type A. Annealing at 800 degrees C. for 30 minutes resulted in annealing out of defect clusters and formation of a regular misfit dislocation network. The interface was highly uniform.

EXAMPLE 2

300 Å of Ni were evaporated onto a Si(111) wafer, followed by annealing for 1 hour at 450 degrees C., resulting in formation of polycrystalline material of average composition about NiSi. Laser irradiation (1.2 J/cm$^2$) produced re-solidified epitaxial material, of average composition $NiSi_{1.6}$, with a high defect concentration and substantially all type B orientation. Heat treating at 800 degrees C. for 30 minutes resulted in highly perfect ($\chi_{min}$~3%) $NiSi_2$ of type B orientation (no type A material detectable by careful TEM examination), with sharp and highly uniform interface.

EXAMPLE 3

660 Å of material of average composition NiSi was co-evaporated onto Si(111). Laser irradiation as in Example 2, the post-anneal at 800 degrees C for 30 minutes, resulted in $NiSi_2$ of substantially the same quality as described in Example 2.

EXAMPLE 4

Depositing 300 Å on Ni onto a Si(100) substrate, heating the composite to 450 degrees C. for 1 hour, and laser irradiating (1.0 J/cm$^2$), resulted in formation of epitaxial material of composition close to $NiSi_{1.6}$, with $\chi_{min}$~40 percent. A furnace anneal at 800 degrees C. for 30 minutes resulted in formation of essentially perfect (100) $NiSi_2$. The interface was sharp and uniform; no faceting was observed.

EXAMPLE 5

Forming a 590 Å thick cobalt silicide layer (average composition about CoSi) on Si(111) by annealing the substrate with a 300 Å layer of Co thereon at 470 degrees C. for 1 hour, and laser irradiating (0.9 J/cm$^2$), resulted in re-solidified material of composition close to $CoSi_{1.5}$, and $\chi_{min}$~0.4. Post-annealing at 1000 degrees C. for 30 minutes resulted in a uniform type B $CoSi_2$ single crystal with $\chi_{min}$=3.1 percent. The interface was sharp and uniform.

EXAMPLE 6

A 1080 Å thick layer of partially epitaxial, $CoSi_2$ ($\chi_{min}$~0.5) was formed on Si(111) by heating the substrate with a 300 Å thick Co layer thereon to 650 degrees C. for 1 hour, and laser irradiating (0.8 J/cm$^2$) the thus produced precursor material of composition $CoSi_2$. Post-annealing at 975 degrees C. for 30 minutes produced a uniform single crystal layer of type B $CoSi_2$, with near-perfect crystallinity ($\chi_{min}$=3.7%), no detectable trace of type A grains, and a sharp and uniform interface.

EXAMPLE 7

Depositing 300 Å of Co onto a Si(100) substrate, heating the composite at 450° C. for 1 hour (resulting in formation of CoSi polycrystals), laser irradiating (0.8 J/cm$^2$), and post-annealing at 950 degrees C. for 30 minutes, resulted in an approximately 1000 Å thick epitaxial layer of $CoSi_2$, with $\chi_{min}$~0.35. Although the thus formed material was not of high crystalline quality, the interface was sharp and substantially uniform, and does not show faceting.

EXAMPLE 8

Results similar to those obtained in Examples 5 and 6 are obtained by co-deposition of CoSi and $CoSi_2$, respectively, with no annealing prior to laser irradiation, and all other conditions substantially as in Examples 5 and 6, respectively.

EXAMPLE 9

Vapor co-depositing 1000 Å of a Si/Ge mixture (80/20 atomic percent) onto Si(100), followed by laser irradiation (about 1 J/cm$^2$), produces a 1000 Å layer of epitaxial material of composition Si$_{0.8}$Ge$_{0.2}$, with a sharp and uniform interface.

EXAMPLE 10

Onto (111) p-type InP is co-evaporated a 1000 Å thick layer of composition WSi$_2$. Laser irradiating (about 1 J/cm$^2$) produces an ohmic contact, with uniform interface between the substrate and the overlayer.

What is claimed is:

1. Method of producing a heterostructure comprising a layer of multiconstituent first material on a single crystal second material substrate, the first material comprising at least a first major constituent and a second major constituent, chemical elements A and B being the first and second major constituent, respectively, the chemical composition of the substrate differing from the chemical composition of the first material, the first material selected from the group consisting of the metals, the semiconductors, and the insulators, the second material selected from the group consisting of Si, Ge, the III-V compound semiconductors, and the II-VI compound semiconductors, the method comprising
   (a) providing the single crystal second material substrate;
   (b) forming a layer of precursor material on at least a part of the substrate, the precursor material having the same major constituents as the first material,
   (c) melting momentarily at least a part of the precursor material by causing pulsed radiation to be incident on the precursor material, the pulsed radiation being electromagnetic radiation, or electron beam radiation, or ion beam radiation, the incident pulsed radiation adjusted to melt the part of the precursor material to at least the substrate/precursor material interface, and
   (d) permitting the melted precursor material to re-solidify, the re-solidified material being said first material.

2. Method of claim 1, wherein at least part of the first material is epitaxial crystalline material.

3. Method of claim 1, wherein the pulse length is at most 1 μsec.

4. Method of claim 1, wherein the layer of first material is a patterned layer.

5. Method of claim 1, wherein the concentration of no major constituent of the precursor material differs by more than 50 percent from the concentration of that major constituent in the first material.

6. Method of claim 1, wherein the first material substantially consists of material selected from the group consisting of the metal silicides and the metal germanates.

7. Method of claim 6, wherein the second material consists substantially of silicon, and the first material consists substantially of a metal silicide.

8. Method of claim 7, wherein the metal silicide has a composition MSi$_x$, with M being an element selected from the group consisting of Ni, Co, Pd, Pt, Cr, W, Ti, Zr, Hf, V, Nb, Ta, Fe, Mg, Rh, and Mo.

9. Method of claim 8 wherein the precursor material has an average composition MSi$_y$, with $0 < y < x$.

10. Method of claim 9, wherein the precursor material is formed by a process comprising depositing an effective amount of element M on the substrate, and maintaining the substrate at a temperature for a time effective to form the precursor material on the substrate.

11. Method of claim 8, further comprising maintaining, subsequent to step (c) of claim 1, the substrate at a temperature of at least about 500° C. for a time effective to result in formation of substantially defect-free, substantially monocrystalline, first material.

12. Method of claim 7, wherein the precursor material is formed by co-deposition of metal and silicon.

13. Method of claim 1, wherein the radiation is laser radiation.

14. Method of claim 1, wherein chemical element B is a major constituent of the substrate, the layer of precursor material being formed by a method comprising
   (i) depositing a layer of third material onto at least a part of the substrate, the third material comprising chemical element A and containing a lower concentration than the precursor material of at least the chemical element B, and
   (ii) maintaining the substrate at a temperature for a time effective for producing precursor material by transport of chemical element B from the substrate into the layer of third material.

15. Method for producing a heterostructure comprising a layer of silicide of composition MSi$_x$ on a major surface of a single crystal Si substrate, the major surface being substantially parallel to a [111] or a [100] crystal plane, M being a chemical element selected from the group consisting of Ni, Co, Pd, Pt, Cr, W, Ti, Zr, Hf, V, Nb, Ta, Fe, Mg, Rh, and Mo, the method comprising
   (a) providing the single crystal Si substrate;
   (b) forming a layer of a precursor material on at least a part of the major surface of the substrate, the precursor material having average composition MSi$_y$, with $0 < y \leq x$,
   (c) melting momentarily at least a part of the precursor material by causing pulsed laser radiation or pulsed electron radiation to be incident on the precursor material, the incident radiation adjusted to melt the precursor material at least to the substrate/precursor material interface, and
   (d) permitting the melted precursor material to re-solidify, the re-solidified material being said first material.

16. Method of claim 15, wherein at least some of the metal silicide is epitaxial metal silicide, the pulse length is at most 1 μsec, and the method further comprises maintaining the substrate with the re-solidified material thereon at a temperature of at least 500° C. for a time sufficient to result in formation of substantially defect-free, substantially monocrystalline, metal silicide.

17. Method of claim 15, wherein the precursor material is formed by a method comprising depositing a layer consisting substantially of element M on the at least part of the major surface, and maintaining the substrate at a temperature for a time effective to result in formation of the precursor material by transport of Si from the substrate into the deposited layer of element M.

* * * * *